(12) United States Patent
Hsieh

(10) Patent No.: US 11,128,496 B2
(45) Date of Patent: Sep. 21, 2021

(54) TRANSMITTER WITH EQUALIZATION

(71) Applicant: MEDIATEK INC., Hsinchu (TW)

(72) Inventor: Hung-Yi Hsieh, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 16/936,467

(22) Filed: Jul. 23, 2020

(65) Prior Publication Data

US 2021/0152399 A1    May 20, 2021

Related U.S. Application Data

(60) Provisional application No. 62/937,285, filed on Nov. 19, 2019.

(51) Int. Cl.
  *H04L 25/02*  (2006.01)
  *H03K 19/0185* (2006.01)
  *H04L 25/03*  (2006.01)

(52) U.S. Cl.
  CPC ......... *H04L 25/0272* (2013.01); *H03K 19/018528* (2013.01); *H04L 25/028* (2013.01); *H04L 25/03878* (2013.01)

(58) Field of Classification Search
  None
  See application file for complete search history.

(56) References Cited

U.S. PATENT DOCUMENTS

| 6,281,715 | B1 | 8/2001 | Declue et al. |
| 8,476,922 | B2 | 7/2013 | Sayuk et al. |
| 9,746,864 | B1 | 8/2017 | Narang et al. |
| 10,191,526 | B2* | 1/2019 | Hafizi .............. H03K 19/00315 |
| 10,691,150 | B1* | 6/2020 | Delshadpour .......... H03K 19/08 |
| 2010/0067521 | A1* | 3/2010 | Fallahi .................. H03H 7/075 370/352 |
| 2012/0146686 | A1 | 6/2012 | Maarouf |
| 2012/0161816 | A1 | 6/2012 | Sumantra et al. |

OTHER PUBLICATIONS

Chan, K.L., et al.; "A 32.75-Gb/s Voltage-Mode Transmitter With Three-Tap FFE in 16-nm CMOS;" IEEE Journal of Solid-State Circuits, vol. 52, No. 10, Oct. 2017; pp. 2663-2678.
Search Report dated Apr. 20, 2021 of its corresponding European patent application No. 20202871.8.
Chinese Language Office Action dated May 20, 2021 of its corresponding Taiwan patent application No. 109140317.

* cited by examiner

*Primary Examiner* — Lincoln D Donovan
*Assistant Examiner* — Khareem E Almo
(74) *Attorney, Agent, or Firm* — McClure, Qualey & Rodack, LLP

(57) ABSTRACT

A transmitter with low power and high accuracy equalization is shown. The transmitter includes a transmitter driver and a driver bias circuit. The transmitter driver receives data, and generates a positive differential output and a negative differential output to be transmitted by the transmitter. The driver bias circuit is coupled to the transmitter driver to bias the transmitter driver, wherein the driver bias circuit is configured to boost the bias level of the transmitter driver in response to transitions of the data.

19 Claims, 8 Drawing Sheets

TRANSMITTER WITH EQUALIZATION

CROSS REFERENCE TO RELATED APPLICATIONS

This application claims the benefit of U.S. Provisional Application No. 62/937,285, filed on Nov. 19, 2019, the entirety of which is incorporated by reference herein.

BACKGROUND OF THE INVENTION

Field of the Invention

The present invention relates to transmitter equalization.

Description of the Related Art

In telecommunication and data transmission, there is a growing demand for serial communication. Large data throughput and low power per bit are achieved by serial links.

However, a high-speed serial link may cause a considerable insertion loss. Equalization is the reversal of distortion incurred by a signal transmitted through a channel, which renders the frequency response flat from end to end. The equalization power is proportional to the number of equalization nodes (N), the signal frequencies (F) at the equalization nodes, the capacitance (C) of the equalization nodes, and the voltage level (V) at the equalization nodes. For example, the equalization power may be proportional to $N*F*C*V^2$. Conventional equalization may result in considerable power consumption.

In a conventional design, equalization is arranged on the output of the transmitter driver. FIG. 1A depicts a transmitter 100, which includes pre-cursor driver slices 102, main-cursor driver slices 104, and post-cursor driver slices 106. By accumulating the outputs of the pre-cursor driver slices 102, main-cursor driver slices 104, and post-cursor driver slices 106, high frequency transitions of data are emphasized.

FIG. 1B depicts waveforms of the transmitter 100. The output of the main-cursor slices 104 is 112.

Without timing shift, the output of the post-cursor slices 106 is 114, and a final waveform 116 is generated by subtracting 114 from 112. As shown, frequent transitions in the main cursor output 112 are reflected in the post cursor output 114 at the proper time, and are successfully emphasized in the final waveform 116 to cope with the transmission loss.

With timing shift, the output of the post-cursor slices 106 is 118, and a final waveform 120 is generated by subtracting 118 from 112. The final waveform 120 shows the poor equalization.

The drawbacks of the transmitter 100 are discussed in this paragraph. All nets (including the pre-cursor driver slices 102, the main-cursor driver slices 104, the post-cursor driver slices 106, and the positive and negative differential output terminals $TX_P$ and $TX_N$) are operated at a high speed, which consumes a lot of power. Timing shift may result in poor equalization (referring to the final waveform 120). When transmitting a direct-current (DC) signal with a high output from the main-cursor driver slices 104 and a low output from the post-cursor driver slices 106, additional power consumption may occur due to a short current between the main-cursor driver slices 104 and the post-cursor driver slices 106.

Low power and high accuracy transmitter equalization is called for.

BRIEF SUMMARY OF THE INVENTION

A transmitter in accordance with an exemplary embodiment of the presented invention includes a transmitter driver and a driver bias circuit. The transmitter driver receives data, and generates a positive differential output and a negative differential output to be transmitted by the transmitter. The driver bias circuit is coupled to the transmitter driver to bias the transmitter driver, and is configured to boost the bias level of the transmitter driver in response to transitions of the data.

The driver bias circuit may be coupled to a common net of the transmitter driver. Equalization on the common net of a transmitter driver rather than on the output of the transmitter driver is presented in the presented invention.

In an exemplary embodiment, the transmitter driver is a voltage-mode driver. The driver bias circuit is configured to boost the voltage level of the common net of the voltage-mode driver in response to transitions of the data.

In another exemplary embodiment, the transmitter driver is a current-mode driver. The driver bias circuit is configured to boost the current level of the common net of the current-mode driver in response to transitions of the data.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1A:
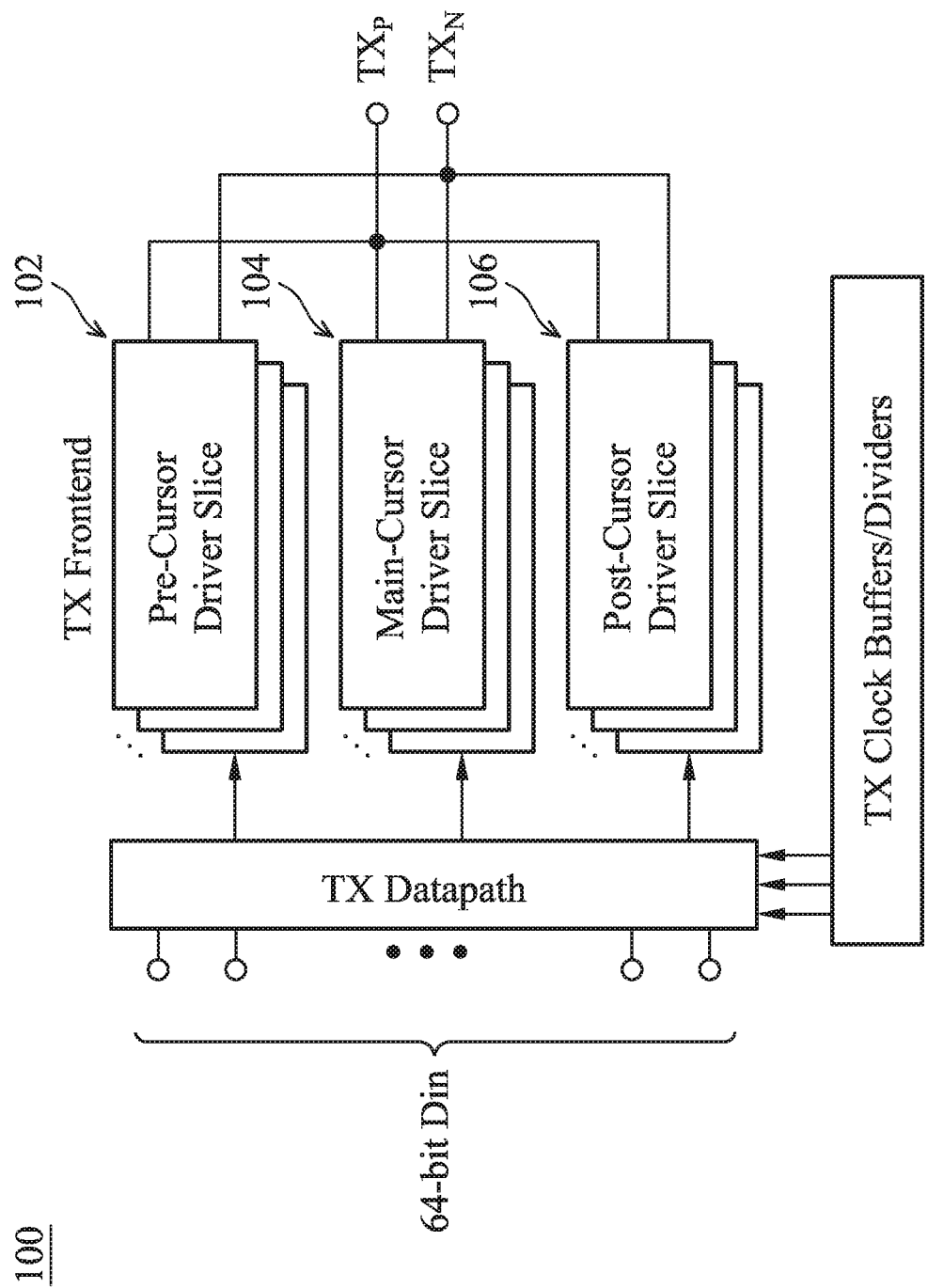
FIG. 1A depicts a transmitter 100, which includes pre-cursor driver slices 102, main-cursor driver slices 104, and post-cursor driver slices 106.
Figure 1B:
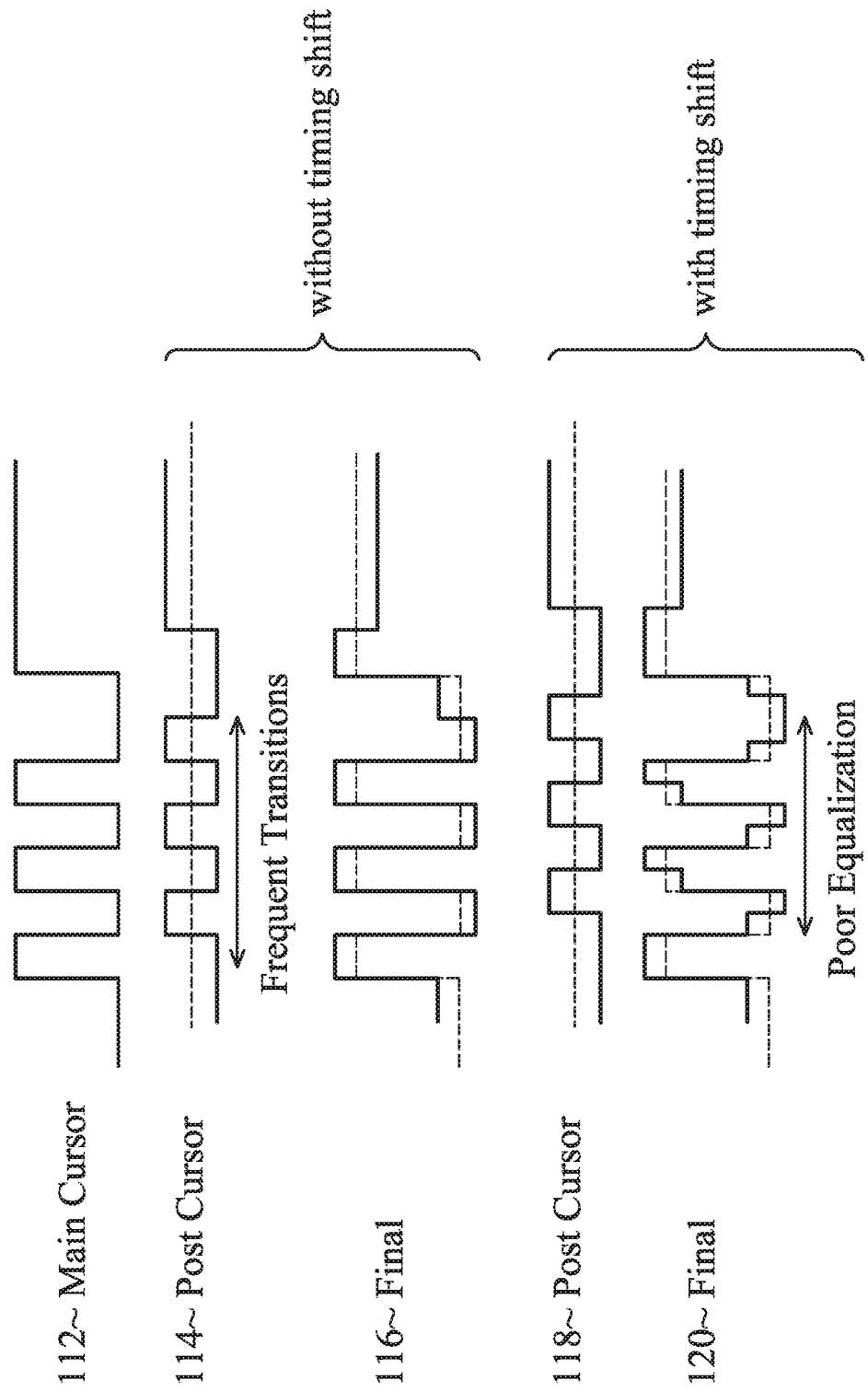
FIG. 1B depicts waveforms of the transmitter 100.
Figure 2A:
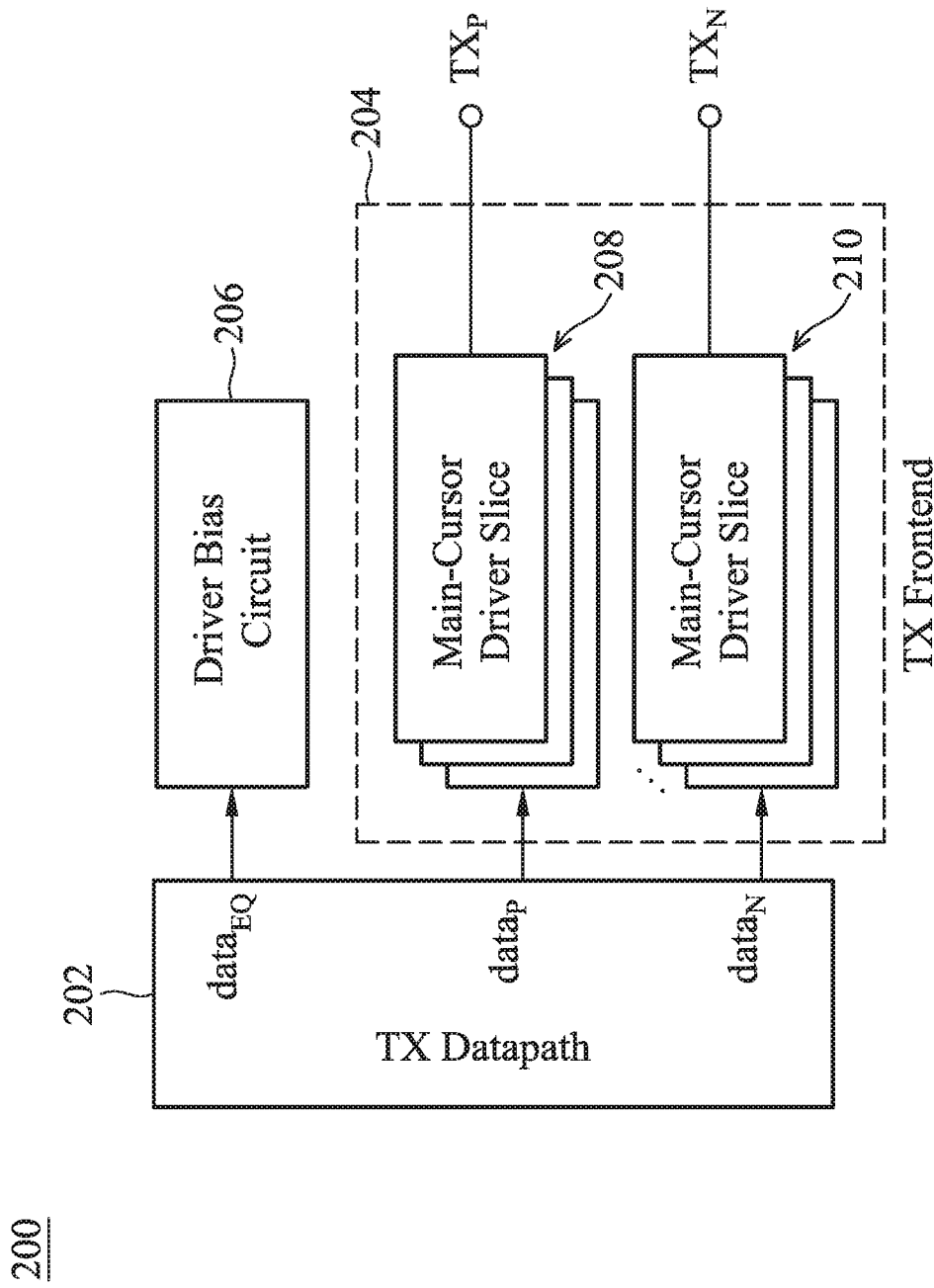
FIG. 2A is a block diagram, depicting a transmitter 200 in accordance with an exemplary embodiment of the present invention.

FIG. 2A is a block diagram, depicting a transmitter 200 in accordance with an exemplary embodiment of the present invention.

The transmitter 200 includes transmitter dataPath 202, a transmitter driver 204, and a driver bias circuit 206. The transmitter dataPath 202 outputs data (represented by a positive part data and a negative part data$_N$) to the transmitter driver 204. The transmitter driver 204 receives the data (represented by data and data$_N$) and, accordingly, generates a positive differential output TX$_P$ and a negative differential output TX$_N$ to be transmitted by the transmitter 200. The driver bias circuit 206 is coupled to the transmitter driver 204 to bias the transmitter driver 204, and is configured to boost the bias level of the transmitter driver 204 in response to transitions of the data. In this example, the driver bias circuit 206 is activated to boost the bias level of the transmitter driver 204 according to a control signal data$_{EQ}$. The control signal data$_{EQ}$ is generated by the transmitter dataPath 202 to indicate the transitions of the data.

In FIG. 2A, main-cursor driver slices 208 generate the positive differential output TX$_P$ based on the positive part data of the data, and main-cursor driver slices 210 generate the negative differential output TX$_N$ based on the negative part data$_N$ of the data. The driver bias circuit 206 is coupled to a common net between the main-cursor driver slices 208 and the main-cursor driver slices 210. Equalization is performed on the common net of the transmitter driver 204 rather than on the differential output terminals (outputting TX$_P$ and TX$_N$) of the transmitter driver 204.

Figure 2B:
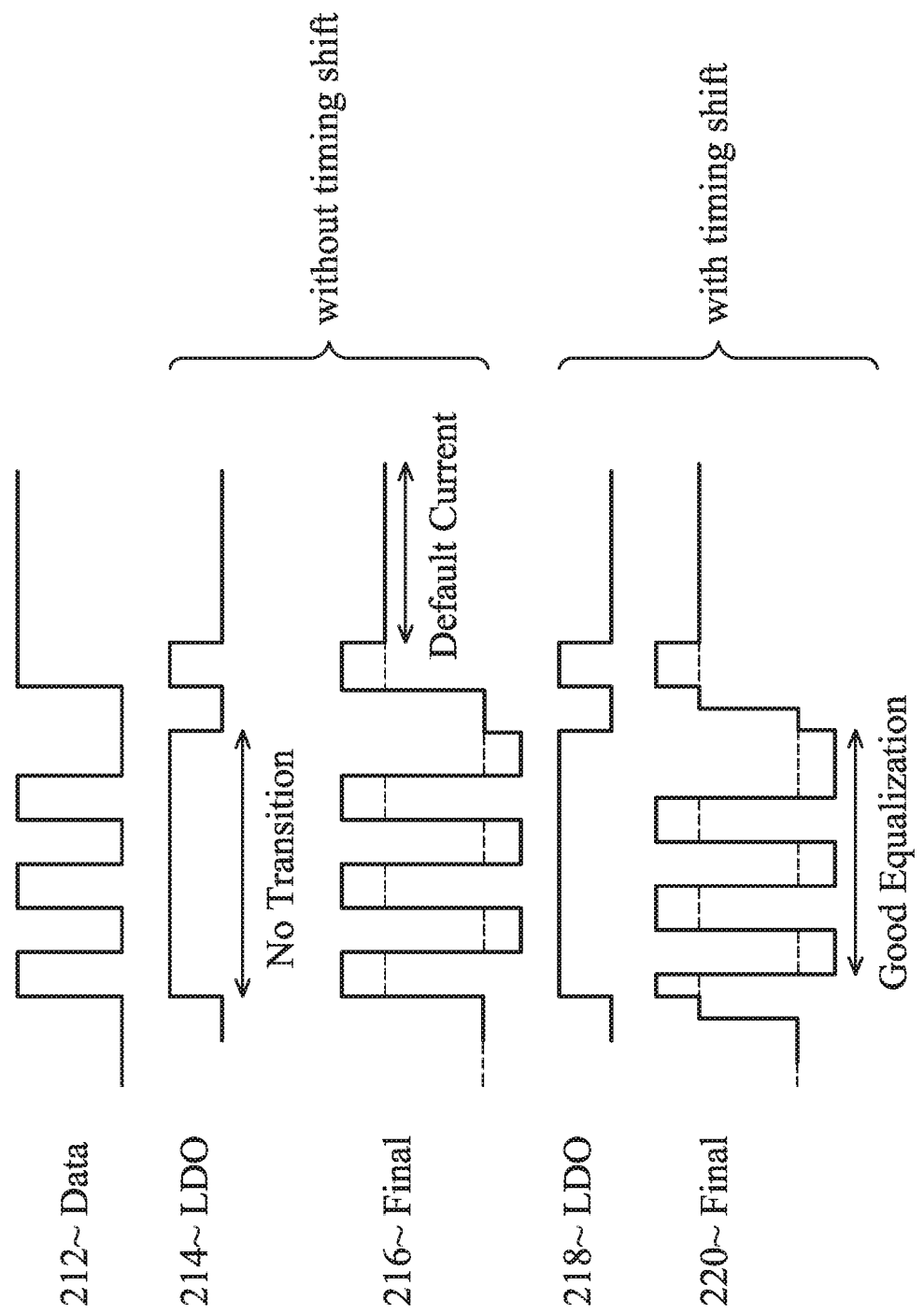
FIG. 2B depicts waveforms of the transmitter 200.

FIG. 2B depicts waveforms of the transmitter 200. The waveform 212 shows the data to be transmitted.

Without timing shift, the change of the bias level (e.g., a bias voltage LDO) of the transmitter driver 204 is presented in the waveform 214, and a final waveform 216 really transmitted by the transmitter 200 is generated. As shown, in response to the frequent data transitions shown in the waveform 212, the bias level (LDO) 214 is boosted at the proper time, and the frequent data transitions are successfully emphasized in the final waveform 216 to cope with the transmission loss.

With timing shift, the waveform 218 shows that the change of the bias level (LDO) of the transmitter driver 204 is delayed, and a final waveform 220 really transmitted by the transmitter 200 is generated. As shown, the final waveform 220 is not dramatically affected by the timing delay, and the equalization is quite good. Simple error correction technique is powerful enough to deal with the imperfect equalization presented in the final waveform 220.

The advantages of the transmitter 200 are discussed in this paragraph. Referring to LDO waveforms 214 and 218, there is no transition on the bias level (LDO) during the frequent data transition interval, which saves a lot of power. As shown in the final waveform 220, equalization on the common net of the transmitter driver 204 is insensitive to timing shift. Furthermore, when transmitting a direct-current (DC) signal, no boost on the bias level (LDO) is required. The driving current is at the default level. This also saves power. Specifically, the equalization strength is well-defined by the bias level and termination resistors. As for the number of equalization nodes, the transmitter 200 uses just one equalization node (e.g., a common node within the common net), less than the equalization nodes (TX$_P$ and TX$_N$) adopted in the transmitter 100. Because the equalization power is proportional to the number of equalization nodes, the equalization power consumed in the transmitter 200 is lower than the equalization power consumed in the transmitter 100.

Figure 3:
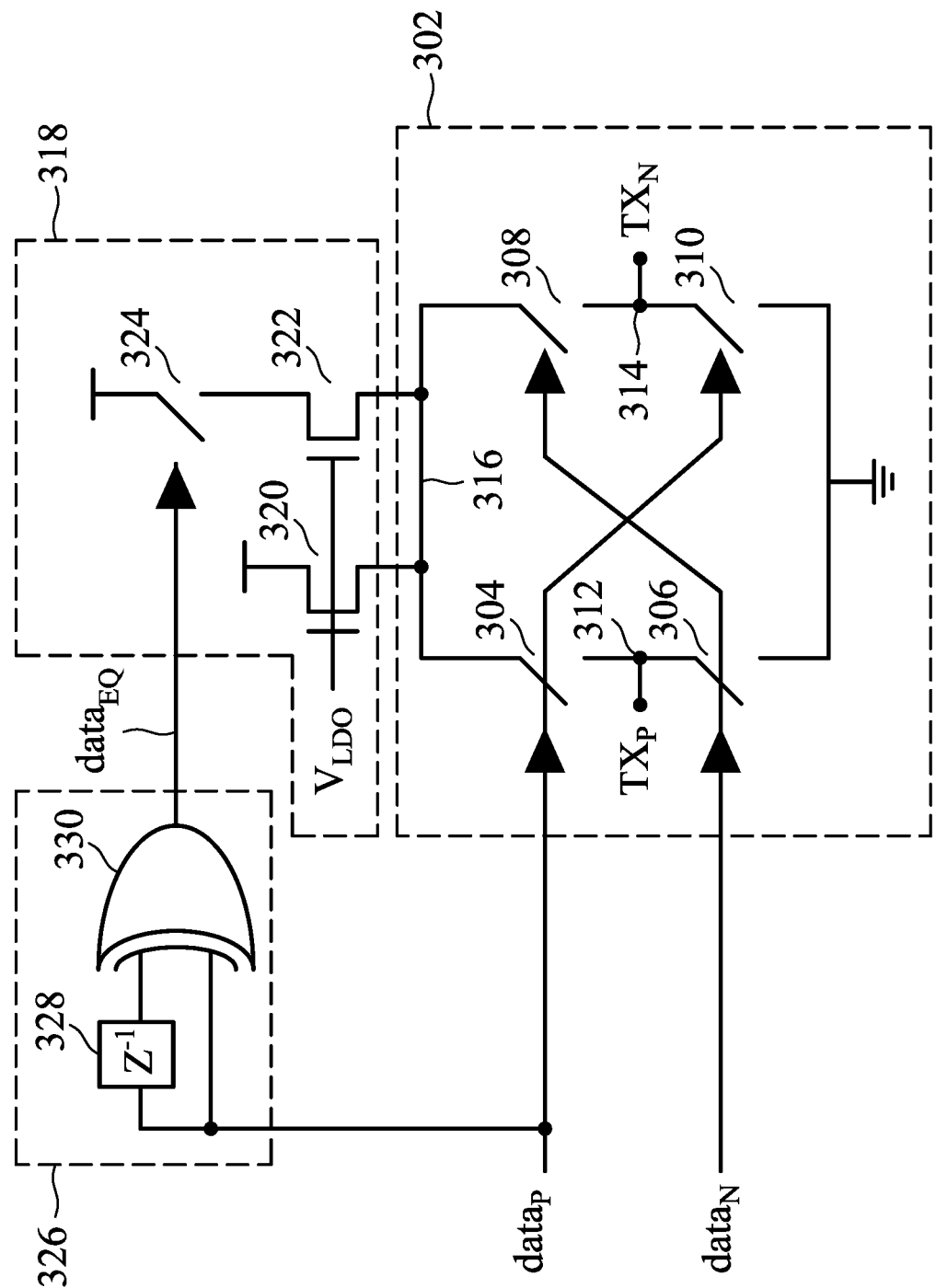
FIG. 3 depicts the detailed circuit of an equalization design for a voltage-mode transmitter in accordance with an exemplary embodiment of the present invention.

FIG. 3 depicts the detailed circuit of an equalization design for a voltage-mode transmitter in accordance with an exemplary embodiment of the present invention.

The transmitter driver (204) is implemented by a voltage-mode driver 302. The voltage-mode driver 302 comprises four switches 304, 306, 308 and 310 and two output terminals 312 and 314. The two output terminals 312 and 314 output the positive and negative differential outputs TX$_P$ and TX$_N$, respectively. The switch 304 is closed according to a positive part (data$_P$) of the data to couple the output terminal 312 to the common net 316. The switch 306 is closed according to a negative part (data$_N$) of the data to couple the output terminal 312 to a ground. The switch 308 is closed according to the negative part (data$_N$) of the data to couple the output terminal 314 to the common net 316. The switch 310 is closed according to the positive part (data$_P$) of the data to couple the output terminal 314 to the ground.

The driver bias circuit 318 comprises two transistors 320 and 322 and a switch 324. The transistors 320 and 322 are biased by a reference voltage V$_{LDO}$. The transistor 320 is coupled between a voltage supply and the common net 316. The transistor 322 is coupled between the voltage supply and the common net 316 when the switch 324 is closed, and the switch 324 is closed according to the control signal data$_{EQ}$. In FIG. 3, there is a transition detection circuit 326 that is configured to detect transitions of the data (represented by data and data$_N$) and generate the control signal data$_{EQ}$ to close the switch 318 in response to transitions of the data. The transition detection circuit 326 comprises a delay unit 328 and an XOR gate 330. The delay unit 328 delays a positive part data of the data. The XOR gate 330 outputs the control signal data$_{EQ}$ based on the positive part data of the data and the delayed data$_P$. In response to the transitions of the data, the control signal data$_{EQ}$ is high and the switch 324 is closed. In FIG. 3, the transistors 320 and 322 are n-type metal oxide semiconductor (NMOS) transistors. When the switch 324 is closed, the conductive transistor size is increased, so that the voltage difference V$_{GS}$ of the transistors 320 and 322 is decreased, and the voltage level of the common net 316 (V$_{LDO}$-V$_{GS}$) is boosted. The differential signal transmitted from TX$_P$ and TX$_N$ during the frequent data transition interval is successfully emphasized.

Figure 4:
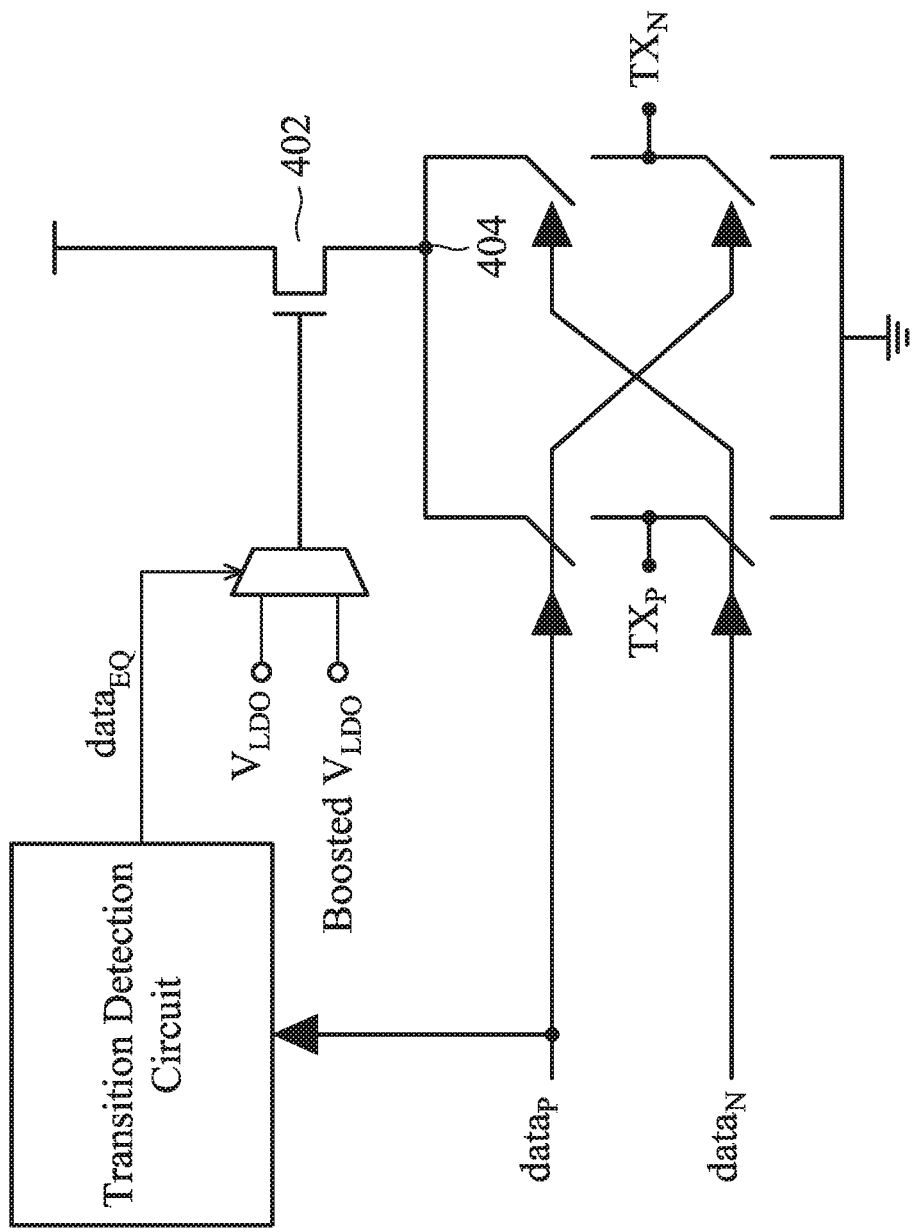
FIG. 4 depicts the detailed circuit of an equalization design for a voltage-mode transmitter in accordance with another exemplary embodiment of the present invention.

FIG. 4 depicts the detailed circuit of an equalization design for a voltage-mode transmitter in accordance with another exemplary embodiment of the present invention. The driver bias circuit comprises transistor 402 coupled between a voltage supply and a common net 404 of the voltage-mode driver. When the control signal data$_{EQ}$ do not indicate any data transition, the transistor 402 is biased by the reference voltage V$_{LDO}$. Otherwise, the transistor 402 is biased by a boosted value of the reference voltage V$_{LDO}$. In FIG. 4, the transistor 402 is an NMOS transistor. Because of the boosted V$_{LDO}$, the voltage level of the common net 404 (V$_{LDO}$-V$_{GS}$) is boosted. The differential signal transmitted from TX$_P$ and TX$_N$ during the frequent data transition interval is successfully emphasized.

Figure 5:
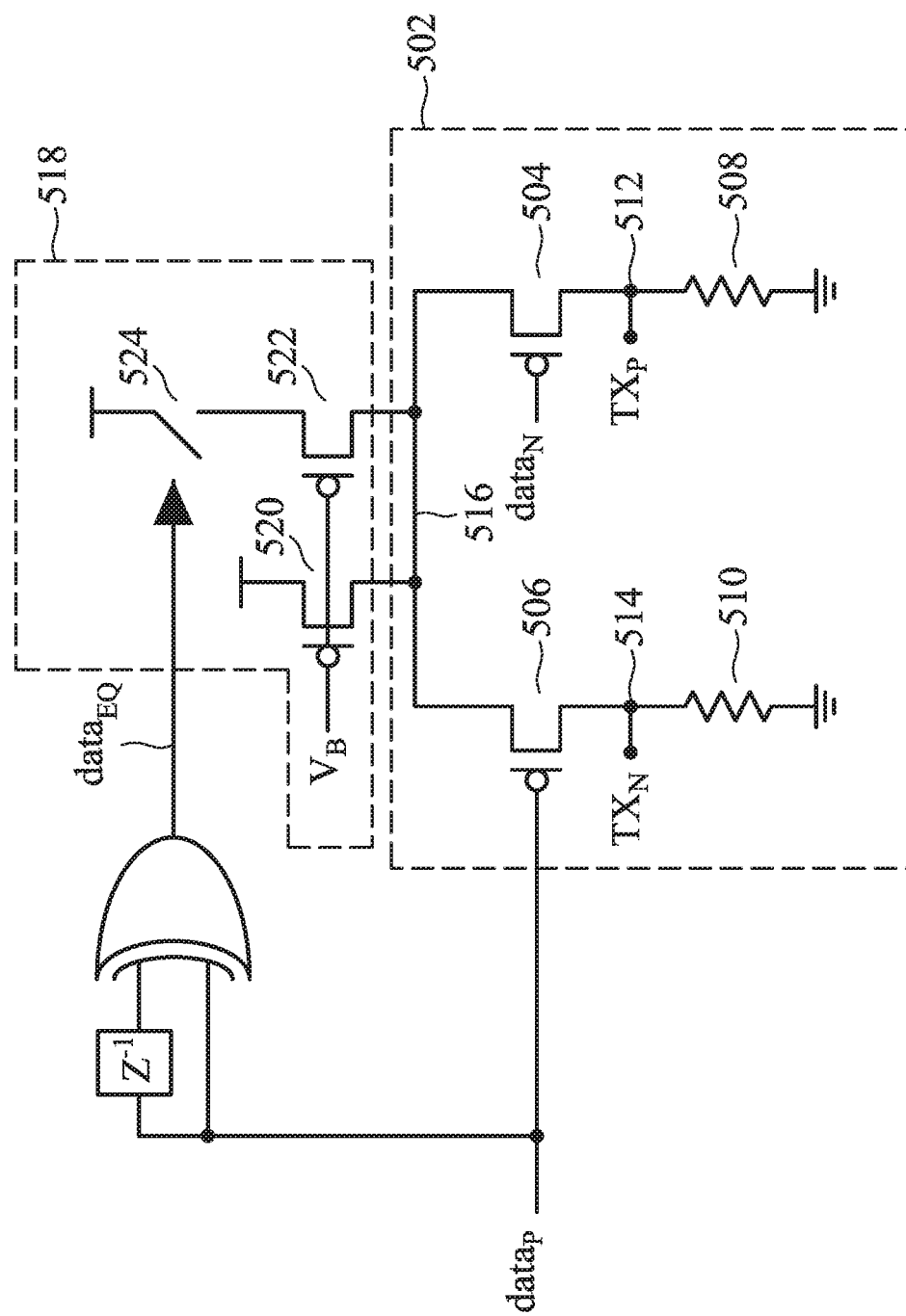
FIG. 5 depicts the detailed circuit of an equalization design for a current-mode transmitter in accordance with an exemplary embodiment of the present invention.

FIG. 5 depicts the detailed circuit of an equalization design for a current-mode transmitter in accordance with an exemplary embodiment of the present invention.

The transmitter driver (204) is implemented by a current-mode driver 502. The current-mode driver 502 comprises two output transistors 504 and 506, two resistors 508 and 510, and two output terminals 512 and 514. The two output terminals 512 and 514 output the positive and negative differential outputs TX$_P$ and TX$_N$, respectively. The output transistor 504 is coupled between a common net 516 of the current-mode driver 502 and the output terminal 512, and is controlled according to the negative part (data$_N$) of the data. The resistor 508 is coupled between the output terminal 512 and the ground. The output transistor 506 is coupled between the common net 516 and the output terminal 514, and is controlled according to the positive part (data$_P$) of the data. The resistor 510 is coupled between the output terminal 514 and the ground. The output transistors 504 and 506 are p-type metal oxide semiconductor (PMOS) transistors.

The driver bias circuit 518 comprises two transistors 520 and 522 and a switch 524. The transistors 520 and 522 are biased by a bias voltage V$_B$. The transistor 520 is coupled between a voltage supply and the common net 516. The transistor 522 is coupled between the voltage supply and the common net 516 when the switch 524 is closed, and the switch 524 is closed according to the control signal data$_{EQ}$. In response to the transitions of the data, the control signal data$_{EQ}$ is high and the switch 524 is closed. In FIG. 5, the transistors 520 and 522 are PMOS transistors. When the switch 524 is closed, the transistor 522 provides additional current to boost the current level of the common net 516. The differential signal transmitted from TX$_P$ and TX$_N$ during the frequent data transition interval is successfully emphasized.

Figure 6:
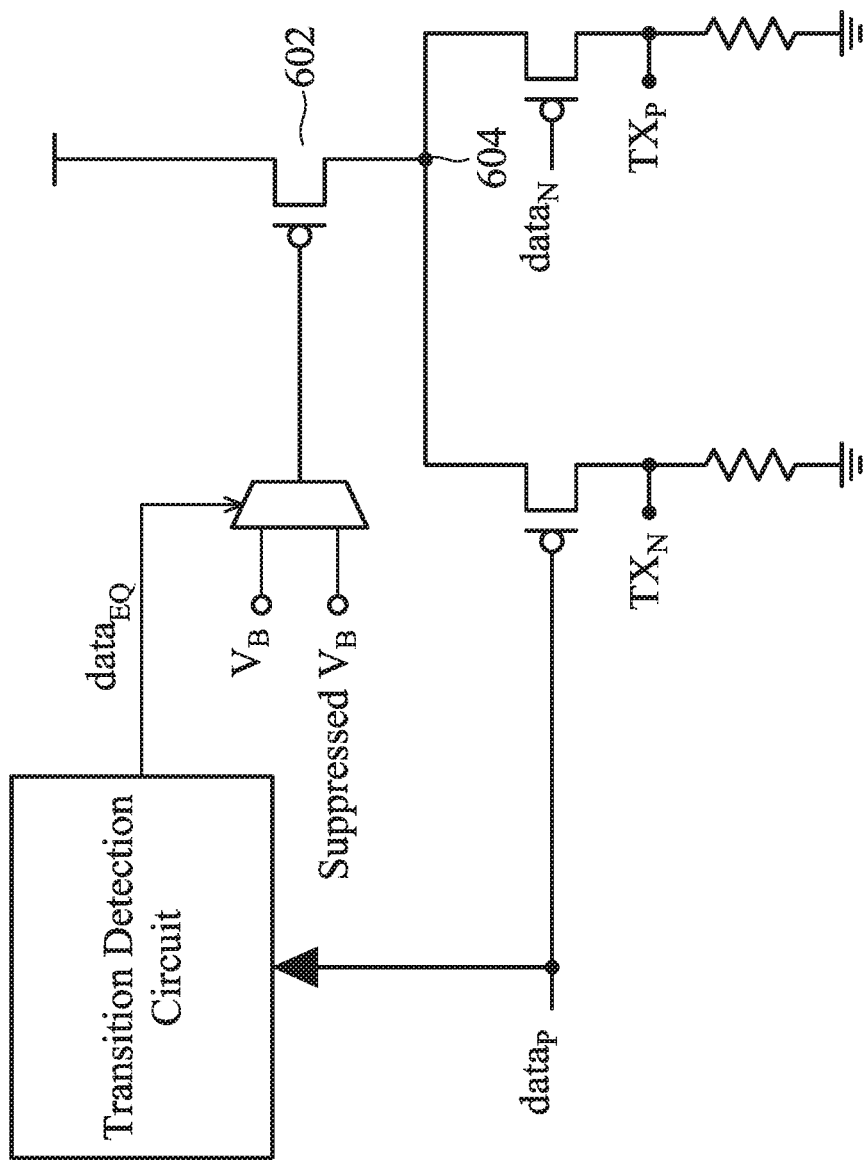
FIG. 6 depicts the detailed circuit of an equalization design for a current-mode transmitter in accordance with another exemplary embodiment of the present invention.

FIG. 6 depicts the detailed circuit of an equalization design for a current-mode transmitter in accordance with another exemplary embodiment of the present invention. The driver bias circuit comprises transistor 602 coupled between a voltage supply and a common net 604 of the current-mode driver. When the control signal data$_{EQ}$ do not indicate any transition on the data, the transistor 602 is biased by the bias voltage V$_B$. Otherwise, the transistor 602 is biased by a suppressed value of the bias voltage V$_B$. In FIG. 6, the transistor 602 is a PMOS transistor. Because of the suppressed V$_B$, the current level of the common net 604 is boosted. The differential signal transmitted from TX$_P$ and TX$_N$ during the frequent data transition interval is successfully emphasized.

There are a variety of designs for the forgoing voltage-mode driver, current-mode driver, driver bias circuit, and transition detection circuit. Any transmitter with equalization on a common net of a transmitter driver should be considered within the scope of protection of the present invention.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transmitter, comprising:
   a transmitter driver, receiving data, and generating a positive differential output and a negative differential output to be transmitted by the transmitter;
   a driver bias circuit, coupled to the transmitter driver to bias the transmitter driver, wherein the driver bias circuit is configured to boost a bias level of the transmitter driver in response to transitions of the data; and
   a transition detection circuit, configured to detect transitions of the data,
   wherein, when detecting transitions of data, the transition detection circuit generates a control signal to control the driver bias circuit to boost the bias level of the transmitter driver.

2. The transmitter as claimed in claim 1, wherein:
   the driver bias circuit is coupled to a common net of the transmitter driver.

3. The transmitter as claimed in claim 2, wherein:
   the transmitter driver is a voltage-mode driver; and
   the driver bias circuit is configured to boost a voltage level of the common net of the voltage-mode driver in response to transitions of the data.

4. The transmitter as claimed in claim 3, wherein the driver bias circuit comprises:
   a first transistor, biased by a reference voltage, and coupled between a voltage supply and the common net; and
   a second transistor biased by the reference voltage and a switch, wherein the second transistor is coupled between the voltage supply and the common net when the switch is closed, and the switch is closed in response to transitions of the data.

5. The transmitter as claimed in claim 4, wherein:
   the transition detection circuit generates the control signal to close the switch in response to transitions of the data.

6. The transmitter as claimed in claim 5, wherein the transition detection circuit comprises:
   a delay unit, delaying a positive part of the data; and
   an XOR gate, outputting the control signal based on the positive part of the data and the delayed positive part of the data.

7. The transmitter as claimed in claim 4, wherein:
   the first transistor and the second transistor are n-type metal oxide semiconductor transistors.

8. The transmitter as claimed in claim 3, wherein the driver bias circuit comprises:
   a transistor, biased by a reference voltage, and coupled between a voltage supply and the common net,
   wherein the reference voltage is boosted in response to transitions of the data.

9. The transmitter as claimed in claim 8, wherein:
   the transistor is an n-type metal oxide semiconductor transistor.

10. The transmitter as claimed in claim 3, wherein the voltage-mode driver comprises:
    a first switch, a second switch, a third switch, and a fourth switch; and
    a first output terminal outputting the positive differential output, and a second output terminal outputting the negative differential output,
    wherein:
    the first switch is closed according to a positive part of the data to couple the first output terminal to the common net;
    the second switch is closed according to a negative part of the data to couple the first output terminal to a ground;
    the third switch is closed according to the negative part of the data to couple the second output terminal to the common net; and
    the fourth switch is closed according to the positive part of the data to couple the second output terminal to the ground.

11. The transmitter as claimed in claim 2, wherein:
    the transmitter driver is a current-mode driver; and
    the driver bias circuit is configured to boost a current level of the common net of the current-mode driver in response to transitions of the data.

12. The transmitter as claimed in claim 11, wherein the driver bias circuit comprises:
    a first transistor, biased by a bias voltage, and coupled between a voltage supply and the common net;

a second transistor biased by the bias voltage and a switch, wherein the second transistor is coupled between the voltage supply and the common net when the switch is closed, and the switch is closed in response to transitions of the data.

13. The transmitter as claimed in claim 12, wherein:
the transition detection circuit generates the control signal to close the switch of the driver bias circuit in response to transitions of the data.

14. The transmitter as claimed in claim 13, wherein the transition detection circuit comprises:
   a delay unit, delaying a positive part of the data; and
   an XOR gate, outputting the control signal based on the positive part of the data and the delayed positive part of the data.

15. The transmitter as claimed in claim 12, wherein:
the first transistor and the second transistor are p-type metal oxide semiconductor transistors.

16. The transmitter as claimed in claim 11, wherein the driver bias circuit comprises:
   a transistor, biased by a bias voltage, and coupled between a voltage supply and the common net,
   wherein the bias voltage is suppressed in response to transitions of the data.

17. The transmitter as claimed in claim 16, wherein:
the transistor is a p-type metal oxide semiconductor transistor.

18. The transmitter as claimed in claim 11, wherein the current-mode driver comprises:
   a first output transistor, a second output transistor, a first resistor, and a second resistor; and
   a first output terminal outputting the positive differential output, and a second output terminal outputting the negative differential output,
   wherein:
   the first output transistor is coupled between the common net and the first output terminal, and is controlled according to a negative part of the data;
   the first resistor is coupled between the first output terminal and a ground;
   the second output transistor is coupled between the common net and the second output terminal, and is controlled according to a positive part of the data; and
   the second resistor is coupled between the second output terminal and the ground.

19. The transmitter as claimed in claim 18, wherein:
the first output transistor and the second output transistor are p-type metal oxide semiconductor transistors.

* * * * *